(12) United States Patent
Grote et al.

(10) Patent No.: US 10,833,174 B2
(45) Date of Patent: Nov. 10, 2020

(54) TRANSISTOR DEVICES WITH EXTENDED DRAIN REGIONS LOCATED IN TRENCH SIDEWALLS

(71) Applicant: NXP USA, INC., Austin, TX (US)

(72) Inventors: Bernhard Grote, Phoenix, AZ (US); Ljubo Radic, Gilbert, AZ (US); Saumitra Raj Mehrotra, Scottsdale, AZ (US); Tania Tricia-Marie Thomas, Austin, TX (US); Mark Edward Gibson, Austin, TX (US)

(73) Assignee: NXP USA, INC., Austin, TX (US)

( * ) Notice: Subject to any disclaimer, the term of this patent is extended or adjusted under 35 U.S.C. 154(b) by 130 days.

(21) Appl. No.: 16/171,830

(22) Filed: Oct. 26, 2018

(65) Prior Publication Data
US 2020/0135896 A1 Apr. 30, 2020

(51) Int. Cl.
| | | |
|---|---|---|
| *H01L 29/66* | (2006.01) | |
| *H01L 29/08* | (2006.01) | |
| *H01L 29/78* | (2006.01) | |
| *H01L 21/22* | (2006.01) | |
| *H01L 29/10* | (2006.01) | |

(Continued)

(52) U.S. Cl.
CPC ........ *H01L 29/66704* (2013.01); *H01L 21/22* (2013.01); *H01L 29/0865* (2013.01); *H01L 29/0869* (2013.01); *H01L 29/0878* (2013.01); *H01L 29/0882* (2013.01); *H01L 29/1095* (2013.01); *H01L 29/404* (2013.01);
(Continued)

(58) Field of Classification Search
CPC ........... H01L 29/66704; H01L 29/0878; H01L 29/0869; H01L 29/404; H01L 21/22; H01L 29/1095; H01L 29/7825; H01L 29/0882; H01L 29/4236; H01L 29/0865; H01L 29/407
See application file for complete search history.

(56) References Cited

U.S. PATENT DOCUMENTS 4,553,151 A * 11/1985 Schutten ............. H01L 29/0653
257/331
4,893,160 A * 1/1990 Blanchard ............. H01L 21/308
257/334
(Continued)

FOREIGN PATENT DOCUMENTS

WO 2005093841 A2 10/2005

OTHER PUBLICATIONS

Notice of Allowance dated Feb. 4, 2020 in U.S. Appl. No. 15/918,563.
(Continued)

*Primary Examiner* — John P. Dulka (57) ABSTRACT

A method of forming a transistor device where an extended drain region is formed by performing angled ion implantation of conductivity dopants of a first conductivity type into the sidewalls and bottom portion of a trench. The bottom portion of the trench is then implanted with dopants of a second conductivity type. Source and drain regions are formed on opposing sides of the trench including in upper portions of the trench sidewalls. A channel region is formed in a trench sidewall below the source region. The trench includes a control terminal structure. After formation of the transistor device, the net conductivity type of the bottom portion of the trench is of the first conductivity type.

20 Claims, 5 Drawing Sheets

(51) Int. Cl.
*H01L 29/423* (2006.01)
*H01L 29/40* (2006.01)

(52) U.S. Cl.
CPC ........ *H01L 29/407* (2013.01); *H01L 29/4236* (2013.01); *H01L 29/7825* (2013.01)

(56) References Cited

U.S. PATENT DOCUMENTS

| | | | |
|---|---|---|---|
| 5,316,959 | A | 5/1994 | Kwan et al. |
| 5,324,683 | A | 6/1994 | Fitch et al. |
| 5,407,860 | A | 4/1995 | Stoltz et al. |
| 5,434,435 | A | 7/1995 | Baliga |
| 5,723,891 | A | 3/1998 | Malhi |
| 5,736,446 | A | 4/1998 | Wu et al. |
| 5,770,507 | A | 6/1998 | Chen et al. |
| 5,869,379 | A | 2/1999 | Gardner et al. |
| 5,914,519 | A | 6/1999 | Chou et al. |
| 6,064,107 | A | 5/2000 | Yeh et al. |
| 6,277,700 | B1 | 8/2001 | Yu et al. |
| 6,858,500 | B2 | 2/2005 | Sugi et al. |
| 6,861,332 | B2 | 3/2005 | Park et al. |
| 6,864,135 | B2 | 3/2005 | Grudowski et al. |
| 6,946,348 | B2 | 9/2005 | Zeng |
| 7,368,785 | B2 | 5/2008 | Chen et al. |
| 7,400,024 | B2 | 7/2008 | Kunnen |
| 7,576,388 | B1 | 8/2009 | Wilson et al. |
| 7,709,889 | B2 | 5/2010 | Moens et al. |
| 7,759,206 | B2 | 7/2010 | Luo et al. |
| 7,800,167 | B2 | 9/2010 | Kitamura et al. |
| 7,893,488 | B2 | 2/2011 | Hebert |
| 7,923,776 | B2 | 4/2011 | Yilmaz et al. |
| 8,043,913 | B2 | 10/2011 | Yilmaz et al. |
| 8,304,312 | B2 | 11/2012 | Hebert |
| 8,319,278 | B1 | 11/2012 | Zeng et al. |
| 8,329,538 | B2 | 12/2012 | Pan et al. |
| 8,502,287 | B2 | 8/2013 | Radic et al. |
| 8,647,950 | B2 | 2/2014 | Zuniga et al. |
| 8,716,794 | B2 | 5/2014 | Luo et al. |
| 8,742,495 | B2 | 6/2014 | Parthasarathy et al. |
| 8,981,470 | B2 | 3/2015 | Nozu |
| 9,171,931 | B2 | 10/2015 | Ng et al. |
| 9,559,198 | B2 | 1/2017 | Stefanov et al. |
| 9,620,583 | B2 | 4/2017 | Kelkar et al. |
| 10,103,257 | B1 | 10/2018 | Qin et al. |
| 2004/0021233 | A1 | 2/2004 | Kinzer et al. |
| 2004/0022123 | A1 | 2/2004 | Kinzer et al. |
| 2006/0001084 | A1 | 1/2006 | Kelly et al. |
| 2006/0017078 | A1 | 1/2006 | Thapar |
| 2006/0209586 | A1 | 9/2006 | Hirler |
| 2009/0256212 | A1 | 10/2009 | Denison et al. |
| 2010/0006929 | A1* | 1/2010 | Andou ............ H01L 29/66734 257/330 |
| 2010/0015770 | A1 | 1/2010 | Tai et al. |
| 2010/0244125 | A1 | 9/2010 | Sonsky et al. |
| 2013/0105888 | A1 | 5/2013 | Zuniga et al. |
| 2013/0181723 | A1 | 7/2013 | Mauder et al. |
| 2013/0334565 | A1 | 12/2013 | Hutzler et al. |
| 2014/0021534 | A1 | 1/2014 | Verma et al. |
| 2014/0097492 | A1 | 4/2014 | Yu |
| 2014/0138739 | A1 | 5/2014 | Magri et al. |
| 2014/0225186 | A1 | 8/2014 | Abou-Khalil et al. |
| 2015/0084123 | A1 | 3/2015 | Kawashiri et al. |
| 2015/0137223 | A1 | 5/2015 | Siemieniec et al. |
| 2015/0380348 | A1 | 12/2015 | Noebauer et al. |
| 2015/0380538 | A1 | 12/2015 | Ogawa |
| 2016/0020315 | A1* | 1/2016 | Hirler ............... H01L 29/0878 257/330 |
| 2016/0211348 | A1 | 7/2016 | Yoshida |
| 2016/0359029 | A1 | 12/2016 | Zeng et al. |
| 2017/0263767 | A1 | 9/2017 | Nishiwaki |
| 2017/0338337 | A1 | 11/2017 | Bobde et al. |
| 2018/0006026 | A1* | 1/2018 | Lui .................... H01L 29/4236 |
| 2018/0006109 | A1 | 1/2018 | Mauder et al. |
| 2018/0090490 | A1 | 3/2018 | Lin et al. |
| 2019/0097046 | A1 | 3/2019 | Mehrotra et al. |
| 2019/0206987 | A1* | 7/2019 | Adachi ............ H02M 7/53871 |

OTHER PUBLICATIONS

Non-final office action dated Jul. 25, 2019 in U.S. Appl. No. 15/918,563.
Final office action dated Jun. 7, 2019 in U.S. Appl. No. 15/715,816.
Notice of Allowance dated Jul. 9, 2019 in U.S. Appl. No. 15/715,852.
Final office action dated Jul. 18, 2019 in U.S. Appl. No. 15/715,831.
Non-final office action dated Feb. 21, 2019 in U.S. Appl. No. 15/715,816.
Ex-Parte Quayle action dated Mar. 5, 2019 in U.S. Appl. No. 15/715,852.
Non-final office action dated Apr. 9, 2019 in U.S. Appl. No. 15/715,831.
Cha, H., "0.18um 100V-rated BCD with Large Area Power LDMOS with ultra-low effective Specific Resistance", IEEE 2016.
Cheng, K., "Air Spacer for 10nrn FinFET CMOS and Beyond", IEEE 2016.
Chil, M., "Advanced 300mm 130NM BCD technology from 5V to 85V with Deep-Trench Isolation", IEEE 2016.
Fujishima, D.H., "Integrated Bi-directional Trench Lateral Power MOSFETs for One Chip Lithium-ion Battery Protection ICs", Proceedings of the 17 International Symposium on Power Semiconductor Devices & IC's, Santa Barbara, CA, May 23-26, 2005.
Yang, H., "Low-Leakage SMARTMOS 10W Technology at 0.13um Node with Optimized Analog, Power and Logic Devices for SOC Design", IEEE 2008.
Yang, H., "Approach to the Silicon Limit: Advanced NLDMOS in 0.13 um SOI Technology for Automotive and Industrial Applications up to 110V", Proceedings of the 25th International Symposium on Power Semiconductor Devices & ICs, Kanazawa, 2013.
Zhigang, W., "Analysis of OFF-state and ON-state performance in a silicon-on-insulator power MOSFET with a low-k dielectric trench", Chinese Institute of Electronics, Journal of Semiconductors, vol. 34, No. 7, Jul. 2013.
U.S. Appl. No. 15/715,816, filed Sep. 26, 2017, entitled "Field-Effect Transistor and Method Therefor".
U.S. Appl. No. 15/715,831, filed Sep. 26, 2017, entitled "Field-Effect Transistor and Method Therefor".
U.S. Appl. No. 15/715,852, filed Sep. 26, 2017, entitled "Field-Effect Transistor and Method Therefor".
U.S. Appl. No. 15/918,563, filed Mar. 12, 2018, entitled "Transistor Trench Structure With Field Plate Structures".
U.S. Appl. No. 16/141,674, filed Sep. 25, 2018, entitled "Transistor Devices With Control-Terminal Field Plate Structures in Trenches".
Non-final office action dated Oct. 15, 2018 in U.S. Appl. No. 15/715,816.
Huang, T., "0.18um BCD Technology with Best-in-Class LDMOS from 6 V to 45 V", Proceedings of the 26th International Symposium on Power Semiconductor Devices & IC's, Jun. 15-19, 2014.
Kumar, M., "Extended-p+ Stepped Gate LDMOS for Improved Performance", IEEE Transactions on Electron Devices, vol. 57, No. 7, Jul. 2010.
Lu, D.H., "Integrated Bi-directional Trench Lateral Power MOSFETs for One Chip Lithium-ion Battery Protection ICs", Proceedings of the 17th International Symposium on Power Semiconductor Devices & IC's, May 23-26, 2005.
Takaya, H., "Floating Island and Thick Bottom Oxide Trench Gate MOSFET (FITMOS)—A 60V Ultra Low On-Resistance Novel MOSFET with Superior Internal Body Diode-", Proceedings of the 17th International Symposium on Power Semiconductor Devices & IC's, May 23-26, 2005.
U.S. Appl. No. 16/174,955, filed Oct. 30, 2018, entitled "Vertical Transistor With Extended Drain Region".
Final office action dated Nov. 19, 2019 in U.S. Appl. No. 15/715,816.
Ex-Parte Quayle action dated Apr. 24, 2019 in U.S. Appl. No. 15/715,852.
U.S. Appl. No. 16/692,517, filed Nov. 22, 2019, entitled "Transistor Formed With Spacer".

(56) References Cited

OTHER PUBLICATIONS

U.S. Appl. No. 16/715,396, filed Dec. 16, 2019, entitled "Transistor With Extended Drain Region".
Ex-Parte Quayle dated Jan. 7, 2020 in U.S. Appl. No. 16/174,955.
Notice of Allowance dated Jan. 21, 2020 in U.S. Appl. No. 15/715,816.
Non-final office action dated Nov. 16, 2018 in U.S. Appl. No. 15/715,852.
U.S. Appl. No. 16/205,461, filed Nov. 30, 2018, entitled "Transistor With Gate/Field Plate Structure".
Non-final office action dated Aug. 8, 2019 in U.S. Appl. No. 15/715,816.
Notice of Allowance dated Sep. 25, 2019 in U.S. Appl. No. 15/715,831.
Notice of Allowance dated Jun. 24, 2020 in U.S. Appl. No. 16/205,461.
U.S. Appl. No. 16/836,293, filed Mar. 31, 2020, entitled Transistor Trench With Field Plate Structure.
U.S. Appl. No. 16/836,344, filed Mar. 31, 2020, entitled Trench With Different Transverse Cross-Sectional Widths.
Notice of Allowance dated Apr. 21, 2020 in U.S. Appl. No. 16/174,955.
Qiao, M., "A Novel Substrate-Assisted RESURF Technology for Small Curvature Radius Junction", Proceedings of the 23rd International Symposium of Power Semiconductor Devices & IC's, May 23-26, 2011.

* cited by examiner

TRANSISTOR DEVICES WITH EXTENDED DRAIN REGIONS LOCATED IN TRENCH SIDEWALLS

BACKGROUND OF THE INVENTION

Field of the Invention

This invention relates in general to transistor devices and more specifically to transistor devices with extended drain regions located in trench sidewalls.

Background

Some types of transistors such as power transistors, high voltage devices, and RF devices (e.g. laterally diffused metal oxide semiconductor (LDMOS), drain extended MOS (DEMOS)) include extended drain regions located in a carrier path between the drain region and the channel region. An extended drain region of a transistor has the same net conductivity type as the drain region of the transistor. In some examples, an extended drain region may provide a transistor with a higher breakdown voltage by reducing the doping in at least part of the extended drain region with respect to the drain region to allow for a voltage drop across a depletion region. In some examples, an extended drain region includes an accumulation region and a drift region.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is a method of forming a transistor device where an extended drain region is formed by performing angled ion implantation of conductivity dopants of a first conductivity type into the sidewalls and bottom portion of a trench. The bottom portion of the trench is then implanted with dopants of a second conductivity type. Source and drain regions are formed on opposing sides of the trench including in upper portions of the trench sidewalls. A channel region is formed in a trench sidewall below the source region. The trench includes a control terminal structure. After formation of the transistor device, the net conductivity type of the bottom portion of the trench is of the first conductivity type. In some embodiments, the implantation of dopants of the second conductivity type into the bottom of the trench corrects a charge imbalance in the bottom portion of the trench due to an excessive dosage of the first conductivity type dopants being implanted into the bottom portion as opposed to the dosages implanted into the vertical side walls during the angled ion implantation.

In one embodiment, the transistor device is a high voltage unidirectional vertical transistor with a source located on one side of the trench and the drain located on the other side of the trench. An extended drain region extends from the drain region to the channel region and includes a portion located under the trench. A control terminal structure (gate) for the transistor is located in the trench.

FIGS. 1-4 set forth partial cutaway side views of various stages of a wafer in the manufacture of a transistor device according to one embodiment of the present invention. FIG. 5 sets forth a partial top view of a wafer during a stage in manufacture according to an embodiment of the present invention. The location of the cutaway side views of FIGS. 1-4 is shown in FIG. 5.

Figure 1:
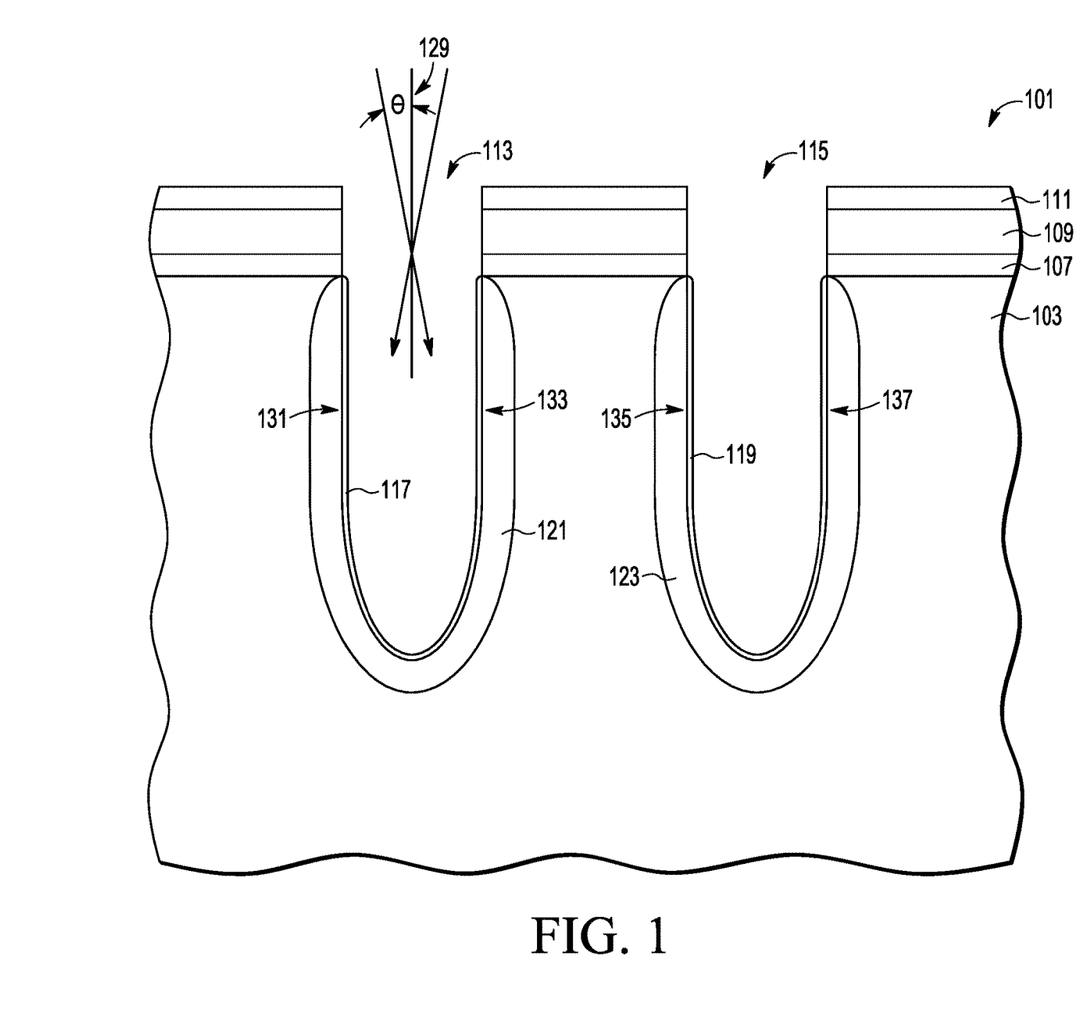
FIGS. 1-4 set forth partial cutaway side views of various stages in the manufacture of a transistor device according to one embodiment of the present invention.

FIG. 1 is a partial cutaway side view showing a portion of wafer 101 with trenches 115 and 113 formed therein. In one embodiment, wafer 101 includes a substrate 103 of semiconductor material. In one embodiment, substrate 103 has a net P-type conductivity doping. In one embodiment, substrate 103 is doped with boron and has a net P-type conductivity dopant concentration of about $2e15$ $cm^{-3}$, but may be doped with other types of dopants and/or may be at other concentrations in other embodiments. In one embodiment, substrate 103 is made of monocrystalline silicon, but may be made of other semiconductor materials (e.g. silicon germanium, germanium, silicon carbide, gallium nitride, gallium arsenide, other semiconductor III-V materials) in other embodiments. In yet another embodiment, substrate 103 may be a semiconductor-on-insulator (SOI) substrate where the trenches are formed in the semiconductor layer located above the insulator layer (not shown). In other embodiments, substrate 103 may be made of layers of different semiconductor material and/or include other regions (not shown) of different conductivity types (e.g. a buried N-type region).

A pad oxide layer 107, nitride layer 109, and oxide layer 111 are formed on substrate 103. Afterwards, trenches 115 and 113 are formed in wafer 101. In one embodiment, the trenches are formed by forming a patterned mask (not shown) on wafer 101 and then anisotropically etching layers 111, 109, 107, and substrate 103 as per the pattern with the appropriate etch chemistries. In other embodiments, other types of hard mask layers may be utilized in forming trenches 115 and 113. In one embodiment, trenches 115 and 113 have a width of 1.50 μm and a depth of 4.0 μm, but may have other widths and/or depths in other embodiments.

After the formation of trenches 113 and 115, a light screen oxide layer (117 and 119) is formed on the trench sidewalls including on vertical sidewalls 131 and 133 of trench 113 and on vertical sidewalls 135 and 137 of trench 115. In one embodiment, oxide layers 117 and 119 have a thickness of 100 A and are formed by an oxidation process, but may be of other thicknesses, of other materials, and/or formed by other methods in other embodiments.

After the formation of the screen oxide layers, N-type dopants (e.g. phosphorous) are ion implanted into the vertical sidewalls and bottom of trenches 113 and 115 by an angled ion implantation process to form regions 121 and 123. The dopants are for forming an extended drain region (see region 301 in FIG. 3). In one embodiment, the angle of implantation (Θ) with respect to a line 129 perpendicular with a major surface of wafer 101 is in the range of 15-25 degrees (e.g. 20 degrees) where the trench has a depth in the range of 3-5 μm and a width of 1.5-2.5 μm. However, in other embodiments, the angle of implantation may be of different values (e.g. 5-45 degrees), where in some embodiments, the angle depends on the width and depth of the trench. In one embodiment, where the dopant is phosphorous, the dopant ions are implanted into the substrate at a dosage of 2.2e13 cm$^{-2}$ and at an energy of 200 keV, with a 20 degrees tilt. In order to avoid device orientation dependence, the implant is performed as a quad implantation with 33 degrees twist, i.e. in 4 implant steps, where a quarter of the dose is implanted for twist increments of 90 degree starting at a 33 degrees rotation with respect to the wafer flat. However, other dopants (e.g. arsenic) may be implanted at other energies and/or at other dosages in one or multiple implantation steps in other embodiments. In some embodiments, a suitable implant condition is dependent upon a doping level and trench profile. In other embodiments, the wafer is continuously rotated during the ion implantation. In still other embodiments, the angle of implantation may change during implantation. During the implantation, layers 107, 109 and 111 prevent dopants from being implanted through the top surface of substrate 103 outside of the areas of the trenches.

One issue with performing an angled ion implant into a trench to implant dopants into a sidewall of the trench to form an extended drain region is that more of the dopant ions will be implanted into the bottom of the trench than in the vertical sidewalls for tilt angles sufficiently steep to avoid complete shadowing of the bottom trench portion. For example, a sidewall maybe exposed for only some of the implantations and not during others where the bottom is exposed during all of the implantations. Also, the ions will strike the vertical sidewalls of the trench at a different angle than at the bottom portion of the trench. Since the wafer dose at the respective silicon surface as projection of the implant beam dose depends on the local tilt angle, lower wafer dose will reach the vertical side walls compared to the bottom of the trench for tilt angles smaller than 45 degrees. In addition, the ion path length through the screen oxide at the side wall is longer than at the trench bottom for tilt angles less than 45 degrees, and may affect the amount of dopants reaching the silicon. This difference in doping concentrations of the extended drain region dopants at the side walls versus at the bottom of the trench may lead to charge balancing issues in the extended drain region during operation. In some instances, the breakdown voltage may be reduced due to the excessive N-type doping in the bottom of the trenches of the extended drain region. Also, for optimal doping at the trench bottom, the side wall doping may be too low for achieving low on-resistance for a given target break-down voltage.

Figure 2:
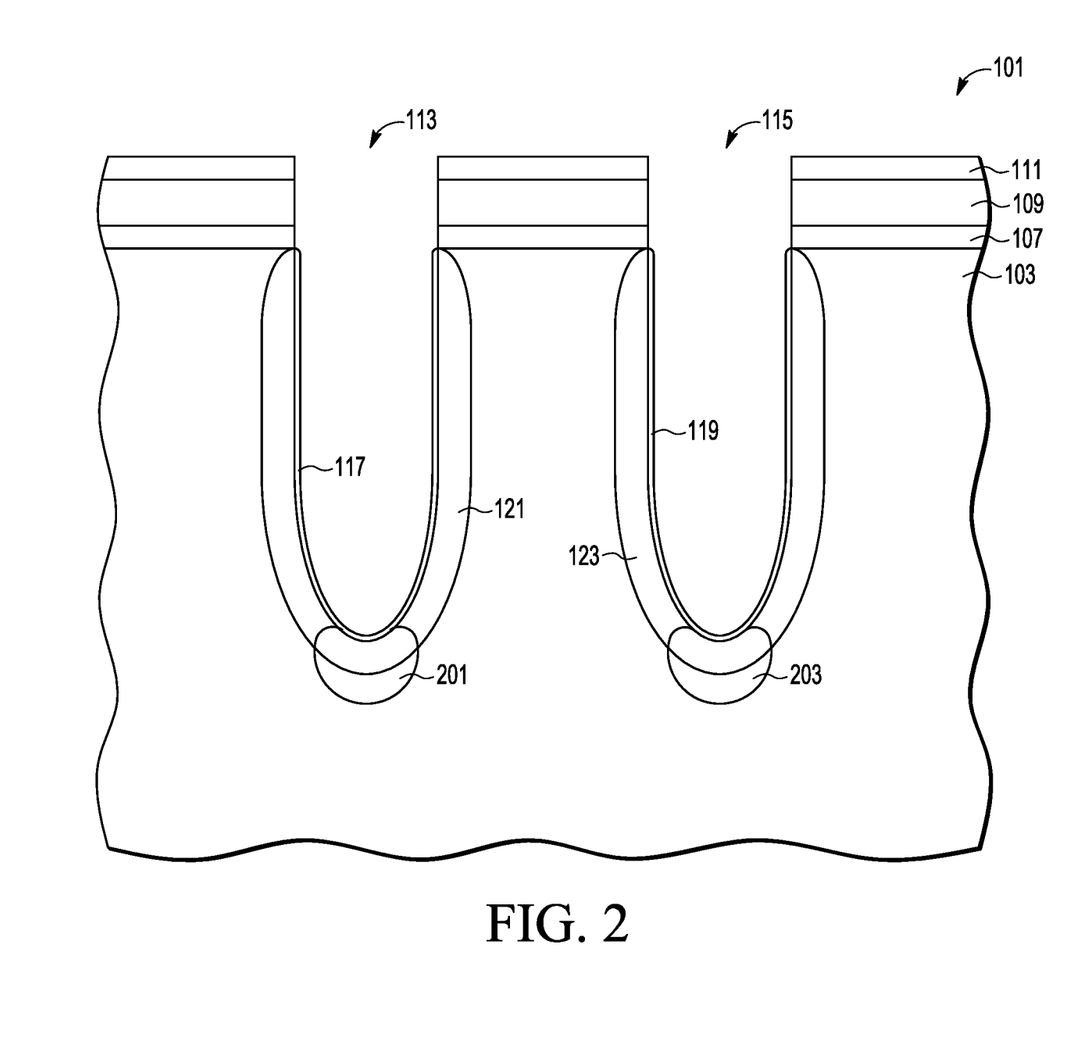

FIG. 2 shows a partial cutaway side view of wafer 101 after an ion implantation of P-type dopants (Boron) are made in the bottom of trenches 113 and 115 to form regions 201 and 203, respectively. In one embodiment, the P-type dopants are made to counter dope the excessive concentration of N-type dopants at the bottom of the trenches due to the angled ion implantations to form regions 121 and 123. In one embodiment, boron ions are implanted at a dosage of 5e12 cm$^2$, at an energy of 70 keV, and at 0 degrees tilt. However, the dosage, energy, and tilt angle may be of other values in other embodiments (e.g. a tilt angle in a range of 0-4 degrees). In some embodiments, the dosages of N-type dopants for implanting regions 121 and 123 is 2-20 times greater than the dosages of P-type dopants for implanting regions 201 and 203, however, this ratio may be of other values in other embodiments. In some embodiments, the dosage would depend on the target breakdown voltage and the dosages of the N-type implants. In some embodiments, the implant energy would depend upon the screen oxide layer (117 and 119) thickness and the depth of the N-type implants. In some embodiments, the thickness of hard mask layers 107, 109, and 111 may need to be sized for both N-type and P-type implant conditions to ensure blocking of the implant in masked areas. In some embodiments, the boron implantation may be performed at a slight angle to provide a variation in the boron profile to match the variation in the N-type dopants in regions 121 and 123. As shown in FIG. 2, the P-type boron dopant implantation is performed with the same hard mask (layers 111, 109 and 107) over wafer 101 as with the angled implantation of the N-type dopants. In some embodiments, the hard mask is the same as was used for etching the trench.

Figure 3:
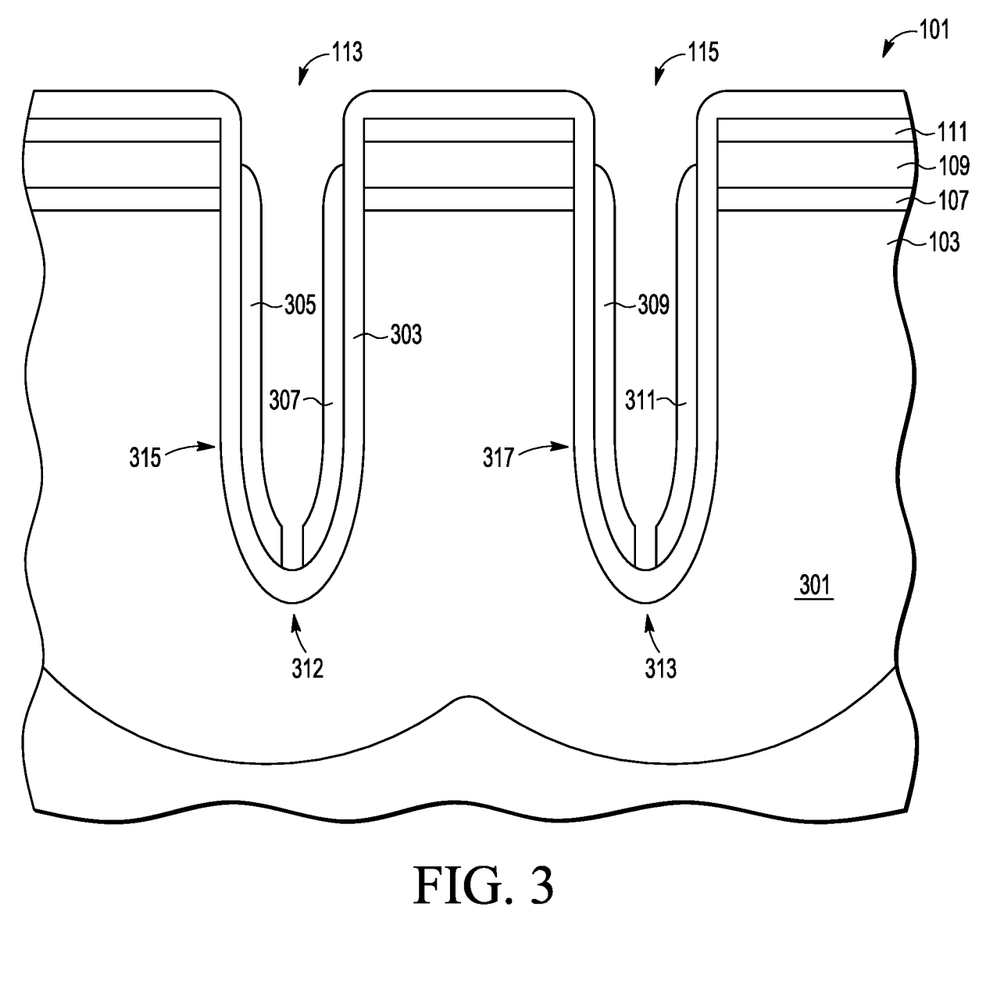

FIG. 3 is a partial cutaway side view of wafer 101 after wafer 101 has undergone further processing including thermal steps such that the N-type dopants of regions 121 and 123 (See FIG. 1) and the P-type dopants of regions 201 and 203 (see FIG. 2) have diffused. These thermal steps may include dedicated implant anneals, sacrificial oxidations, and densification after TEOS oxide deposition. In one embodiment, wafer 101 is heated at a temperature of 1000 C for a duration of 20 minutes, but may be annealed by other processes in other embodiments. As a result of the diffusion, the net charge type at the bottom portions 312 and 313 of trenches 113 and 115, respectively, is N-type with the phosphorous concentration being higher than the boron concentration. Furthermore, the net charge concentration at bottom portions 312 and 313 is close to the net charge concentrations at locations 315 and 317 along the vertical sidewalls of trenches 113 and 115, respectively. In one embodiment, the net N-type doping concentration at the bottom portions are within 15% of a net N-type doping concentration of the vertical sidewall locations. In some embodiments, the N-type doping is optimized for low on-resistance for a given target breakdown voltage and may depend on silicon pillar width and field oxide thicknesses affecting the depletion in the source and drain silicon pillars, as well as P-type substrate concentration influencing the depletion at the bottom of the trench. Therefore, in some embodiments, different net doping levels may be desirable in the source side pillar, drain side pillar and trench bottom. In some embodiments, it may be desirable to provide a lower the net N-type concentration at the bottom of a trench than on a vertical side wall of the trench in the extended drain region.

FIG. 3 also shows wafer 101 after a conformal layer 303 of oxide is formed on wafer 101 including in trenches 113 and 115, field plate structures 305 and 307 are formed in trench 113, and field plate structures 309 and 311 are formed in trench 115. Prior to forming layer 303, the screen oxide layers 117 and 119 (see FIG. 2) are removed. In one embodiment, oxide layer 303 has a thickness of about 0.3 μm and is deposited by a chemical vapor deposition process. However, in other embodiments, layer 303 may be formed by other processes (e.g. an oxidation process) or combinations thereof, have other thicknesses, and/or be made of other materials (e.g. another dielectric material). In one embodiment, layer 303 has a thickness so as to provide an adequate spacing between a field plate structure (e.g. 305) and the semiconductor surface of a trench (e.g. 113, 115) so as to provide a field dielectric thickness which can be optimized for breakdown voltage and on-resistance.

In one embodiment, field plate structures 305, 307, 309, and 311 are made of polysilicon, but may be of other conductive materials in other embodiments. In one embodiment, field plate structures 305, 307, 309, and 311 are formed from a layer of field plate material deposited over wafer 101 (e.g. by a chemical vapor deposition process) which is then subsequently anisotropically etched to form the field plates structures. In one embodiment, field plate structures 305, 307, 309, and 311 have a thickness of about 0.25 μm, but have other thicknesses in other embodiments. Also, in other embodiments, the field plate structures may be formed by other methods.

Figure 4:
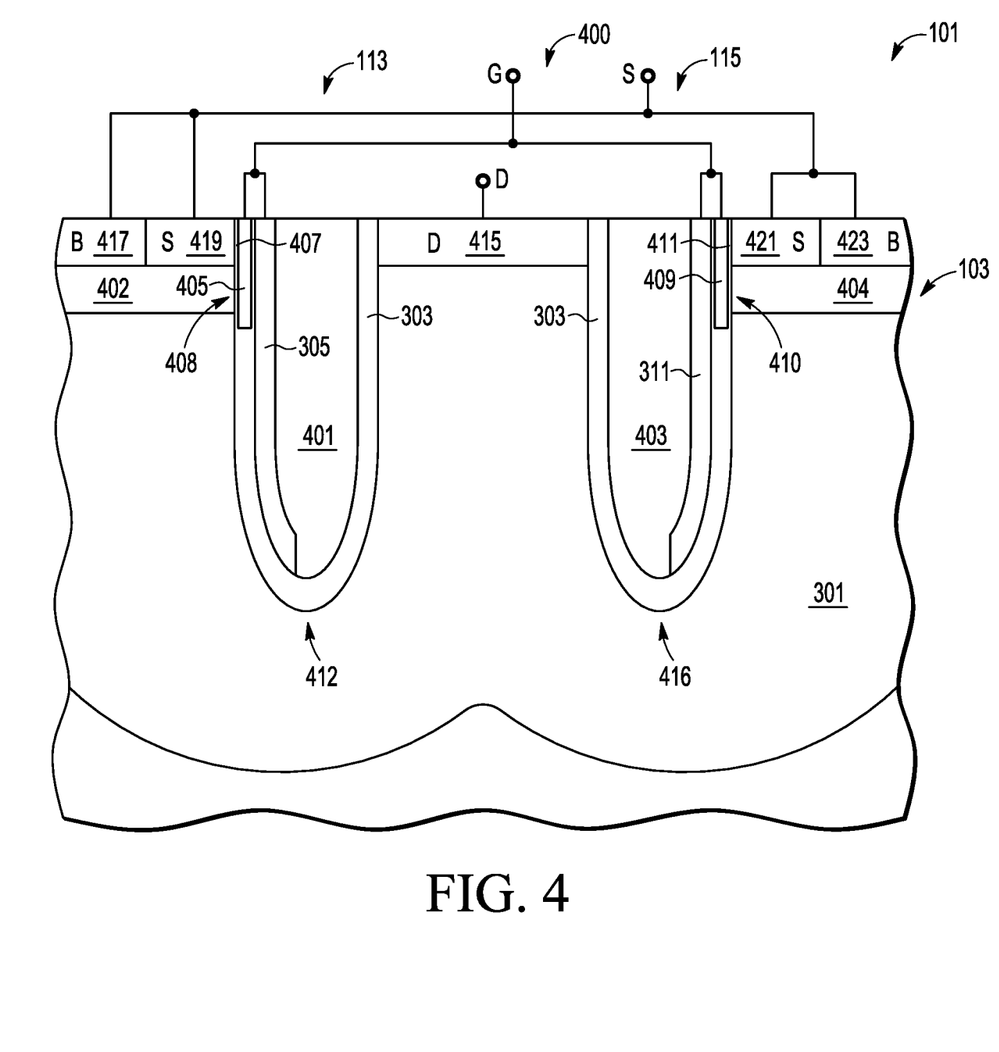
Figure 5:
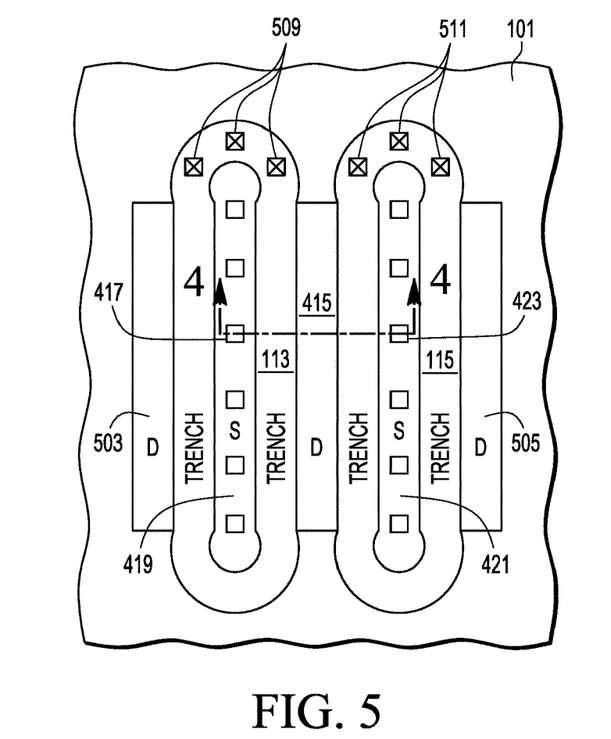
FIG. 5 sets forth a partial top view of a stage in the manufacture of a transistor device according to one embodiment of the present invention.

FIG. 4 shows a partial cutaway side view after field plate structures 307 and 309 (see FIG. 3) are removed and gate structures 405 and 409 are formed in trenches 113 and 115, respectively. In one embodiment, after the stage of FIG. 3, the trenches are filled with an oxide and planarized. Then layer 303 and the subsequently added oxide are etched down into the trenches to a level just below the bottom extent of gate structures 405 and 409 as shown in FIG. 4. A gate oxide 407 and 411 is formed on the exposed portions of the trench side walls and on the field plate structures 305, 307, 309, and 311. Afterwards, the openings in trenches are filled with polysilicon where the wafer is planarized to form gate structures 405 and 409, along with sacrificial gate structures (not shown) on the other side of the trenches. Also formed in the trenches are sacrificial poly structures (not shown) formed between field plate structures 305 and 307 and between field plate structures 309 and 311. A mask (not shown) is formed on wafer 101 and openings are created in the mask to remove by etching, all of the poly structures (including field plate structure 307) in trench 113 except gate structure 405 and field plate structure 305 and all of the poly structures (including field plate structure 309) in trench 115 except field plate structures 311 and gate structure 409. The remaining voids in the trenches are then filled with a dielectric material, which include portions of dielectric 401 and 403 shown in FIG. 4. Further details of this process can be found in a patent application entitled "Transistor Trench Structure with Field Plate Structures," having a serial number of Ser. No. 15/918,563, having a filing date of Mar. 12, 2018, and having a common assignee, all of which is hereby incorporated by reference in its entirety.

FIG. 4 also shows wafer 101 after the formation of P-well regions 402 and 404 in substrate 103 by ion implantation of P-type dopants (e.g. boron). In one embodiment, boron is selectively implanted in wafer 101 at an energy of 180 keV and dosage of $1.2e13$ $cm^{-2}$, but may be implanted at other energies and/or other dosages in other embodiments. In one embodiment, implantation is followed by an annealing step. In some embodiments, a drain buffer implant is selectively implanted in the drain pillar (the portion of substrate 103 between trenches 113 and 115) may be used to optimize the snap-back voltage in the on-state (not shown here).

Afterwards, source regions 419 and 421 and drain region 415 are formed by the selective implantation of N-type dopants into P-well regions 1307 and 1309, respectively. Drain region 415 is formed by the selective implantation of N-type dopants into wafer 101. The N-type dopant ions are implanted through a patterned implant mask (not shown) formed on wafer 101. In one embodiment, arsenic ions are implanted at a dose of $5e15$ $cm^{-2}$ and at an energy of 120 keV followed by a phosphorus implant with dose of $1.5e15$ $cm^2$ and energy of 55 keV. Other N-type dopants may be implanted at other doses and/or at other energies in other embodiments.

Body contact regions 417 and 423 are also formed in well regions 402 and 404 respectively. In one embodiment, regions 417 and 423 are formed by selectively implanting through a mask, boron ions at a dose of $1.5e15$ $cm^{-2}$ and at an energy of at 25 keV into well regions 402 and 404, respectively. Implantation is followed by an annealing step, e.g. rapid thermal annealing (RTA). Other P-type dopants may be implanted at other doses and/or at other energies in other embodiments.

Channel region 408 is located in well region 402 along the sidewall of trench 113. Channel region 410 is located in well region 404 along the sidewall of trench 115. When a gate structure (405, 409) is biased for a transistor to be conductive, an inversion field forms in a channel region (408, 410) along the trench structure sidewall of the P-well region (402, 404) between the source region (419, 421) and the extended drain region 301.

The structures shown in FIG. 4 form a transistor 400 where gate structures 405 and 409 are tied together to implement a gate for transistor 400 and the source regions 419 and 421 are tied together and implement the source for transistor 400. In other embodiments, the gate structures and source regions would be separately controllable to form two transistors.

FIG. 5 is a partial top view of wafer 101 showing the cross-section location of FIG. 4. In the embodiment shown, wafer 101 includes drain regions 503, 415, and 505 and source regions 419 and 421. Wafer 101 also includes body contact regions 417 and 423 along with other body contact regions in source regions 419 and 421. In the embodiment shown, trenches 113 and 115 follow the elongated dumbbell shape of source regions 419 and 421, respectively. Not shown in FIG. 5 are the gate structures 405 and 409 (See FIG. 4) or the field plate structures 305 and 311 (see FIG. 4) in trenches 113 and 115, respectively. Gate contact areas 509 in FIG. 5 show the location of contacts for contacting conductive structure 405 and 305 in trench 113 and gate contact areas 511 show the location of contacts for contacting conductive structures 311 and 409 in trench 115. Not shown in FIG. 5 are the contacts for the source, drain, and body contact regions. A transistor may have other layouts including a different number of source regions, drain regions, and trenches in other embodiments.

Referring back to FIG. 4, after the formation of source regions 419 and 421, drain region 415, and body contact regions 417 and 423, a layer (not shown) of interlevel dielectric material is formed on wafer 101. In one embodiment, the layer is an oxide formed by a TEOS process, but may be of another material in other embodiments. Openings are then formed in the layer for the formation of metal contacts (not shown) to electrically contact the transistor structures. In the embodiment shown, a set of one or more contacts (not shown) contact both source region 419 and body contact region 417 and another set of one or more contacts (not shown) contact both source region 421 and body contact region 423. Another set of one or more contacts (not shown) contact drain region 415. One set of contacts (not shown) contacts gate structure 405 and field plate structure 305 at contact areas 509 and another set of contacts (not shown) contact field plate structure 311 and gate structure 409 at contact areas 511 (see FIG. 5). In some embodiments, the source regions and body contact regions may have different contacts to be individually biased at different voltages. In some embodiments, the gate structures and field plate structures may have different contacts to be individually biased at different voltages.

After the stage shown in FIGS. 4 and 5, other processes may be performed on wafer 101 such as forming additional interconnect layers. For example, interconnects may be formed to electrically couple together structures 405 and 409. Afterwards, external terminals e.g. bond pads are formed on wafer 101. Wafer 101 is then singulated into multiple die where each die includes at least one transistor device having structures shown in FIGS. 1-5. Afterwards, the die are packaged in semiconductor packaging material to form integrated circuit packages where they are shipped to end use manufacturers to include in end use products such as automobiles, battery control systems, and industrial equipment. In other embodiments, a transistor device may include other structures and/or may be formed by other processes. Furthermore, additional process steps may be added to form other components on the same die.

In other embodiments, trenches 113 and 115 may be formed by multiple etch processes. In one such embodiment, a first trench would be formed in the substrate wherein spacers (e.g. nitride, oxide) would be formed on the sidewalls of the first trench. Afterwards, a second trench would be formed through the openings in the sidewall spacers. After the formation of the second trench, extended drain region dopants would be implanted by an angled ion implantation operation followed by the implantation of the P-type counter dopants in the bottom of the second trench. Afterwards, a thick oxide layer is formed on the sidewalls of the second trench to provide a resultant trench with different dielectric thicknesses at different locations on the sidewalls. Also, in some embodiments, a single conductive structure may serve as both the gate and field plate for a transistor. See the application entitled "Transistor Devices with Control-Terminal Field Plate Structures in Trenches," having a serial number of Ser. No. 16/141,674, having a filing date of Sep. 25, 2018, and having a common assignee, all of which is hereby incorporated by reference in its entirety.

Figure 6:
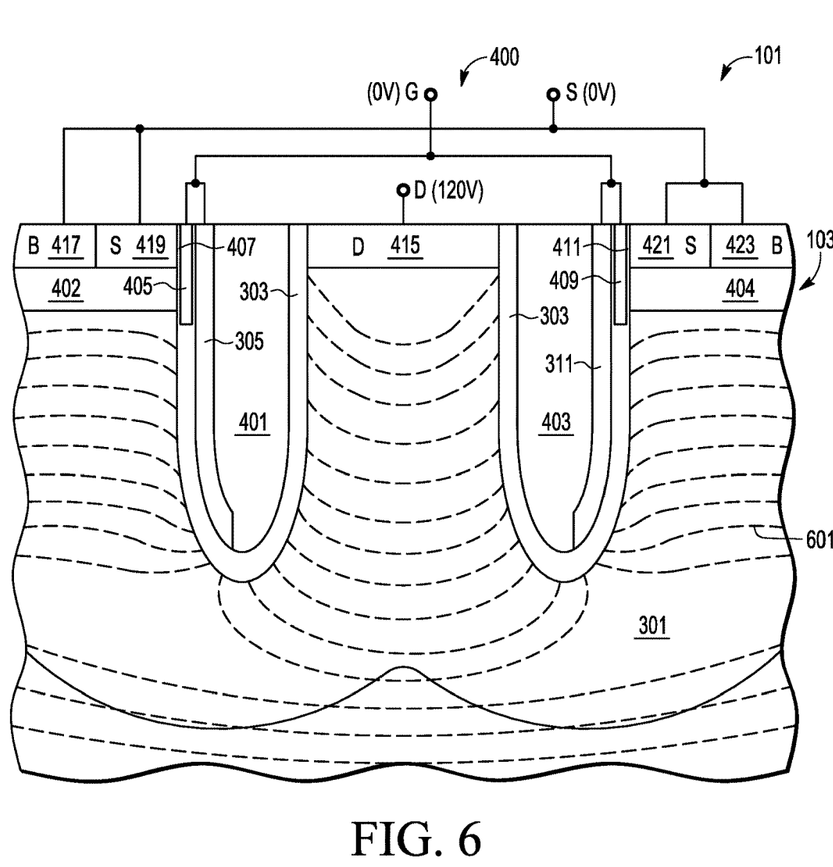
FIG. 6 is a partial side view illustration showing potential fields and the electrical coupling of a transistor device during an operating condition according to one embodiment of the present invention.

FIG. 6 shows a partial cross-sectional side view of transistor 400 during an off-state mode of operation according to one embodiment. In the embodiment shown, gate structures 405 and 409, conductive plate structures 305 and 311, source regions 419 and 421, and body contact regions 417 and 423 are each grounded. 120V is applied to drain region 415.

FIG. 6 shows the equipotential lines 601 representing of the electrostatic fields of transistor 400 that occur in substrate 103. As can be shown in FIG. 6, the electrostatic potential between the higher drain voltages (120V) and the lower source voltages (ground) are dissipated in the extended drain region 301 that extends from the drain region 415, underneath trenches 113 and 115, to the P well regions 402 and 404, respectively. In one embodiment, the amount of dissipation by transistor 400 is dependent upon the depth of the trenches (113 and 115), the width of the trenches, the field oxide (303) thicknesses, the distances between the trenches (113, 115), and the depth and doping concentration of the P well regions 402 and 404 and extended drain region 301. In one embodiment, the breakdown voltage of transistor 400 is in the range of 20V to 250V, but may be of other voltages in other embodiments. In one embodiment, because of the counter doping in the bottom of the trenches 113 and 115, the equipotential lines are close to evenly spaced around the bottom of the trench such as not to limit the break down voltage.

In the embodiment of FIGS. 1-6, the conductive field plate structures 305 and 311 are closer to the source side of the trenches 113 and 115, respectively, than the drain side of the trenches. Accordingly, there is a greater amount of dielectric between the conductive field plate structures 305 and 311 and the higher voltage drain region 415. This increased dielectric thickness between the conductive field plate structures 305 and 311 and drain region 415 may provide for a greater amount of electrostatic potential dissipation by the dielectric in trenches (113 and 115) from the conductive field plate structure (305 and 311), thereby raising the breakdown voltage in those areas.

In other embodiments, the conductive field plate structure may be located in the middle of a trench (113). In some embodiments, the gate and field plate structure may be implemented by a single conductive structure located in the middle of the trench.

In some embodiments, transistor 400 can be used as a power switch or high voltage analog device. In other embodiments, transistor 400 maybe formed by different processes, have different structures, and/or have different configurations. For example, the body contact regions 417 and 423 may be separately biased from source regions 419 and 421. In some embodiments, the gate and/or field plate structures may include portions located outside of a trench.

In one embodiment, using an angled implantation operation to implant dopants in the vertical sidewall of a trench may provide for a transistor with reduced electrical parameter variability due to trench depth variation compared to alternative ways of forming the extended drain region such as implantation from the top surface or epitaxial growth of an N-type region. For transistors that use these alternative methods of forming the extended drain region, the bottom junction depth is independent from the trench depth such that the trench depth variation directly influences the charge balance in this region. A deeper trench may reduce the total charge underneath the trench leading to dramatic increase of on-resistance due to reduced doping in addition to a gradual increase due to a longer current path. For shallower trench depth than target, excessive charge at the bottom of the trench may limit the breakdown voltage leading to a steep drop with decreasing trench depth. In contrast for embodiments described herein, the depth of the extended drain region correlates directly with the trench depth, such that the net-doping at the trench bottom is nearly unaffected by trench depth variation and electrical performance varies only gradually due to variation of the drift length. Implanting counter dopants in the bottom of the trench may provide for a transistor with better charge balancing in the extended drain region. In some embodiments, the N-type implantation dose can independently be optimized for breakdown and/or on-resistance in the source and drain pillars, since the P-type implant allows for correcting the charge balance at the bottom of the trench by counter doping excessive doping from the N-type implant.

Although the transistors described above are N-type transistors, the processes shown and described above can be used to make P-type transistors as well by switching the net conductivity type of at least some of the semiconductor regions. They may also be used to make other types of transistors in other embodiments.

As disclosed herein, a first structure is "directly over" a second structure if the first structure is located over the second structure in a line having a direction that is perpendicular with the generally planar major side of a wafer. For example, in FIG. 4, source region 419 is directly over extended drain region 301. Source region 419 is not directly over P-well region 404. As disclosed herein, a first structure is "directly beneath" a second structure if the first structure is located beneath the second structure in a line having a direction that is perpendicular with the generally planar major side of the wafer. For example, in FIG. 4, extended drain region 301 is directly beneath body contact region 423. Field plate structure 305 is not directly beneath source region 419. One structure is "directly between" two other structures in a line if the two structures are located on opposite sides of the one structure in the line. For example, in FIG. 4, field plate structure 305 is located directly between structure 405 and dielectric 401 in a line in the cut away side view of FIG. 4. Region 301 is not located directly between regions 419 and 415 in a line. A "lateral line" is a line that is parallel with a generally planar major side of the wafer. In FIG. 4, structure 305 and drain region 415 are located in a lateral line. Region 415 and region 301 are not located in a lateral line. As disclosed herein, a first structure is "laterally separated" from a second structure if there is separation between the two structures in a line that is parallel with a generally planar major side of the wafer. For example, in FIG. 4, field plate structures 305 and 311 are laterally separated from each other. As disclosed herein, a "lateral distance" is the distance in a direction that is parallel with a generally planar major side of the wafer. A "vertical component sidewall" of a trench is a portion of a trench sidewall having a profile that overall, the majority component of the portion is vertical even though it may also have a horizontal component or that it may have minor horizontal discontinuity at an interior location of the sidewall portion. For example, a portion of a sidewall sloped at 70 degrees may be considered a vertical component sidewall portion.

Features shown or described herein with respect to one embodiment may be implemented in other embodiments shown or described herein.

In one embodiment, a method for forming a transistor device includes forming a trench in a semiconductor material. The trench includes a first vertical component sidewall of the semiconductor material and a second vertical component sidewall of the semiconductor material opposite the first vertical component sidewall. the trench includes a bottom portion of the semiconductor material. The method includes implanting dopants of a first conductivity type for an extended drain region of a transistor device into the first vertical component sidewall, into the second vertical component sidewall, and into the bottom portion. The implanting dopants is performed with an angled ion implantation process. The method includes implanting dopants of a second conductivity type into the bottom portion of the trench, wherein the second conductivity type is opposite the first conductivity type. The method includes forming a source region for the transistor device of the first conductivity type including a portion in an upper portion of the first vertical component sidewall. The method includes forming a drain region for the transistor device of the first conductivity type including a portion in an upper portion of the second vertical component sidewall. The method includes forming a channel region of dopants of the second conductivity type in a portion of the first vertical component sidewall below the source region. The method includes forming a control terminal structure for the transistor device including a portion located in the trench. The bottom portion of the trench has a net first conductivity type concentration after the implanting dopants of the first conductivity type, the implanting dopants of the second conductivity type, and the formation of the source region, the drain region, and the control terminal structure.

In another embodiment, a method for forming a transistor device includes forming a trench in a semiconductor material. The trench includes a first vertical component sidewall of the semiconductor material and a second vertical component sidewall of the semiconductor material opposite the first vertical component sidewall. The trench includes a bottom portion of the semiconductor material. The method includes implanting dopants of a first conductivity type for an extended drain region of a transistor device through an opening in a mask into the first vertical component sidewall, into the second vertical component sidewall, and into the bottom portion. The implanting dopants is performed with an angled ion implantation process. The mask is located over the semiconductor material and the opening corresponds to a location of the trench. The method includes implanting dopants of a second conductivity type through the opening into the bottom portion of the trench. The second conductivity type is opposite the first conductivity type. The method includes removing the mask. The method includes forming a source region for the transistor device of the first conductivity type and forming a drain region for the transistor device of the first conductivity type. The trench is located laterally between the source region and the drain region. The method includes forming a channel region of dopants of the second conductivity type in a portion of the first vertical component sidewall below the source region. The method includes forming a control terminal structure for the transistor device including a portion located in the trench. The bottom portion of the trench has a net first conductivity type concentration after the implanting dopants of a first conductivity type, the implanting dopants of the second conductivity type, and the formation of the source region, the drain region, and the control terminal structure.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a transistor device comprising:
    forming a trench in a semiconductor material, the trench including a first vertical component sidewall of the semiconductor material and a second vertical component sidewall of the semiconductor material opposite the first vertical component sidewall, the trench including a bottom portion of the semiconductor material;
    implanting dopants of a first conductivity type for an extended drain region of the transistor device into the first vertical component sidewall, into the second vertical component sidewall, and into the bottom portion, wherein the implanting dopants is performed with an angled ion implantation process;
    implanting dopants of a second conductivity type into the bottom portion of the trench, wherein the second conductivity type is opposite the first conductivity type;
    forming a source region for the transistor device of the first conductivity type including a portion in an upper portion of the first vertical component sidewall;
    forming a drain region for the transistor device of the first conductivity type including a portion in an upper portion of the second vertical component sidewall;
    forming a channel region of dopants of the second conductivity type in a portion of the first vertical component sidewall below the source region;
    forming a control terminal structure for the transistor device including a portion located in the trench;
    wherein the bottom portion of the trench has a net first conductivity type concentration after the implanting dopants of the first conductivity type, the implanting dopants of the second conductivity type, and the formation of the source region, the drain region, and the control terminal structure.

2. The method of claim 1 wherein as a result of the implanting dopants of a first conductivity type for an extended drain region of the transistor device into a first vertical component sidewall and into the second vertical component sidewall, the bottom portion has a greater concentration of first conductivity type dopants than the first vertical component sidewall and a greater concentration of first conductivity type dopants than the second vertical component sidewall.

3. The method of claim 1 wherein the semiconductor material is located in a wafer, the method comprises annealing the wafer after the implanting dopants of the first conductivity type and the implanting dopants of the second conductivity type, wherein dopants of the first conductivity type diffuse away from the first vertical component sidewall, the second vertical component sidewall, and the bottom portion.

4. The method of claim 1 wherein the control terminal structure is laterally closer to the first vertical component sidewall than the second vertical component sidewall.

5. The method of claim 1 forming a field plate structure in the trench, wherein the field plate structure extends deeper in the trench than the control terminal structure.

6. The method of claim 1 wherein the semiconductor material is located in a wafer, wherein the implanting dopants of a first conductivity type for the extended drain region is performed with an angled ion implantation process at an angle from a line that is perpendicular with a major surface of the wafer wherein the angle is in a range of 5-45 degrees.

7. The method of claim 1 wherein the implanting dopants is performed with an angled ion implantation process at a first implant dosage, wherein the implanting dopants of the second conductivity type into the bottom portion of the trench is performed at a second implant dosage, where the first implant dosage is in a range of 2 to 20 times greater than the second implant dosage.

8. The method of claim 1 wherein the dopants of the first conductivity type are implanted into the first vertical component sidewall, into the second vertical component sidewall, and into the bottom portion are phosphorous dopants.

9. The method of claim 8 wherein the dopants of the second conductivity type implanted into the bottom portion of the trench are boron dopants.

10. The method of claim 1 wherein the semiconductor material is located in a wafer, wherein the implanting dopants of the second conductivity type into the bottom portion is performed at an angle in a range of 0-4 degrees with a line that is perpendicular with a major surface of the wafer.

11. The method of claim 1 wherein the semiconductor material is located in a wafer, wherein the wafer includes an implant mask located over the wafer during the implanting dopants of the first conductivity type for an extended drain region, wherein the implant mask has an opening corresponding to a location of the trench, wherein dopants of the first conductivity type are implanted into the first vertical component sidewall, into the second vertical component sidewall, and into the bottom portion through the opening.

12. The method of claim 11 wherein the implant mask is located over the wafer during the implanting dopants of the second conductivity type, wherein dopants of the second conductivity type are implanted through the opening into the bottom portion.

13. The method of claim 1 wherein after the implanting dopants of the first conductivity type and implanting dopants of the second conductivity type, forming a layer of dielectric material in the trench, the method further includes forming a field plate structure in the trench, wherein the field plate structure is laterally separated from a portion of the first vertical component sidewall by at least the layer of dielectric material.

14. The method of claim 13 wherein the forming the control terminal structure includes removing a portion of the layer of dielectric material to form an opening wherein the control terminal structure is located in the opening.

15. The method of claim 1 wherein the transistor device is characterized as an N-type transistor.

16. The method of claim 1 wherein the source region and the drain region are located at a top surface of the semiconductor material.

17. The method of claim 1 wherein the transistor device has a breakdown voltage in a range of 20 volts to 250 volts.

18. The method of claim 1 wherein a net doping concentration of the first conductivity type at the bottom portion of the trench is within 15% of a net doping concentration of the first conductivity type at a portion of the first vertical component sidewall in the extended drain region.

19. A method for forming a transistor device comprising:
forming a trench in a semiconductor material, the trench including a first vertical component sidewall of the semiconductor material and a second vertical component sidewall of the semiconductor material opposite the first vertical component sidewall, the trench including a bottom portion of the semiconductor material;
implanting dopants of a first conductivity type for an extended drain region of the transistor device through an opening in a mask into the first vertical component sidewall, into the second vertical component sidewall, and into the bottom portion, wherein the implanting dopants is performed with an angled ion implantation process, wherein the mask is located over the semiconductor material and the opening corresponds to a location of the trench;
implanting dopants of a second conductivity type through the opening into the bottom portion of the trench, wherein the second conductivity type is opposite the first conductivity type;
removing the mask;
forming a source region for the transistor device of the first conductivity type;
forming a drain region for the transistor device of the first conductivity type, wherein the trench is located laterally between the source region and the drain region;
forming a channel region of dopants of the second conductivity type in a portion of the first vertical component sidewall below the source region;
forming a control terminal structure for the transistor device including a portion located in the trench;
wherein the bottom portion of the trench has a net first conductivity type concentration after the implanting dopants of a first conductivity type, the implanting dopants of the second conductivity type, and the formation of the source region, the drain region, and the control terminal structure.

20. The method of claim 19 wherein the implanting dopants is performed with an angled ion implantation process at a first implant dosage, wherein the implanting dopants of the second conductivity type into the bottom portion of the trench is performed at a second implant dosage, where the first implant dosage is in a range of 2 to 20 times greater than the second implant dosage.

* * * * *